US006535038B2

(12) United States Patent  (10) Patent No.: US 6,535,038 B2
Hofstra  (45) Date of Patent: Mar. 18, 2003

(54) REDUCED JITTER CLOCK GENERATOR CIRCUIT AND METHOD FOR APPLYING PROPERLY PHASED CLOCK SIGNALS TO CLOCKED DEVICES

(75) Inventor: Joseph Hofstra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/802,363

(22) Filed: Mar. 9, 2001

(65) Prior Publication Data

US 2002/0125927 A1 Sep. 12, 2002

(51) Int. Cl.[7] ................................................ H03L 7/06
(52) U.S. Cl. ........................ 327/158; 327/149; 327/153; 327/161
(58) Field of Search ................................ 327/144, 145, 327/147, 149, 150, 153, 154, 156, 158, 159, 161, 261, 269, 271, 295

(56) References Cited

U.S. PATENT DOCUMENTS

| 5,087,829 | A | * | 2/1992 | Ishibashi et al. | ............. | 327/152 |
| 5,307,381 | A | * | 4/1994 | Ahuja | ......................... | 375/107 |
| 5,451,911 | A | * | 9/1995 | Colvin et al. | ................... | 331/57 |
| 5,548,235 | A | * | 8/1996 | Marbot | ........................ | 327/158 |
| 5,578,945 | A | * | 11/1996 | Flora | ............................ | 326/93 |
| 5,619,170 | A | * | 4/1997 | Nakamura | ................... | 331/1 A |
| 5,640,547 | A | * | 6/1997 | Hotta et al. | .................. | 395/555 |
| 5,684,421 | A | * | 11/1997 | Chapman et al. | ............ | 327/261 |
| 5,764,092 | A | * | 6/1998 | Wada et al. | .................. | 327/271 |
| 5,777,498 | A | * | 7/1998 | Cometti | ........................ | 327/156 |
| 5,777,501 | A | * | 7/1998 | AbouSeido | .................. | 327/274 |
| 5,831,459 | A | * | 11/1998 | McDonald | ................... | 327/141 |
| 5,852,380 | A | * | 12/1998 | Yamauchi | .................... | 327/243 |
| 5,852,640 | A | * | 12/1998 | Kliza et al. | .................. | 375/356 |
| 5,999,576 | A | * | 12/1999 | Lee | ............................ | 375/333 |
| 6,044,122 | A | * | 3/2000 | Ellersick et al. | ............. | 375/360 |
| 6,131,168 | A | * | 10/2000 | Kryzkowski | ................ | 713/503 |

* cited by examiner

Primary Examiner—Timothy P. Callahan
Assistant Examiner—Hai L. Nguyen
(74) Attorney, Agent, or Firm—Dorsey & Whitney LLP

(57) ABSTRACT

A clock driver circuit includes a phase-lock loop that generates a processed clock signal from an input clock signal. The processed clock signal is applied to a series of delay elements each of which has an output coupled to the input of a respective driver circuit. The outputs of the driver circuits are coupled to respective clocked circuits through respective conductors. The length of each conductor may vary from the lengths of other conductors. The longer conductors are coupled to upstream delay elements and the shorter conductors are coupled to downsteam delay elements so that the clock signals are applied to respective clocked circuits at substantially the same time. The delay elements thus compensate for variations in the propagation time of the clock signals as they are coupled to the clocked circuits.

61 Claims, 5 Drawing Sheets

REDUCED JITTER CLOCK GENERATOR CIRCUIT AND METHOD FOR APPLYING PROPERLY PHASED CLOCK SIGNALS TO CLOCKED DEVICES

TECHNICAL FIELD

This invention relates to clock generator circuits, and, more particularly, to clock generator circuits used to apply properly phased clock signals to multiple clocked devices.

BACKGROUND OF THE INVENTION

Periodic clock signals are for a wide variety of purposes in electronic systems, such as memory devices. Clock signals are typically generated by an oscillator, but clock signals generated by an oscillator may have properties that make them unsuitable for some purposes. For example, such clock signals may exhibit excessive phase jitter, i.e., variations in the phase or timing of the clock signal. While phase jitter may not be a problem in many applications, in some applications where timing in a circuit must be precisely controlled, phase jitter can be unacceptable.

On approach to reducing phase jitter is to process the clock signal with a locked-loop, such as a phase-lock loop or a delay-lock loop. The dynamics of feedback in the loop can be controlled, such as by low-pass filtering the loop, so that a processed clock signal generated by the locked-loop has relatively little phase jitter.

Processing a clock signal using a locked-loop provides acceptable performance in applications where the clock signal is applied to a single circuit or relatively few circuits. However, problems can develop if the processed clock signal is applied to a large number of clocked circuits. These problems are essentially twofold. First, it is generally not possible to place the circuits to which the processed clock signal is applied the same distance from the locked-loop. Consequently, transitions of the clock signal can arrive at each of the circuits at different times. Yet the major function of the clock signal is to ensure that signals in all of the circuits are registered at the same time. This problem has been recognized, and attempts have been made to solve it. One approach, for example, is shown in FIG. 1. A clock generator circuit 10 includes a driver circuit 16 that receives a pair of complimentary clock signals CLK and CLK*. The driver circuit 16 converts the complimentary clock signals CLK and CLK* into a single-ended clock signal that is applied to a phase-lock loop 20. The phase-lock loop 20 generates a processed clock signal CLK-P that is applied to several driver circuits 24. The first driver circuit 24a outputs a complimentary pair of clock signals CLK-OUT and CLK-OUT* that are used as complimentary feedback signals. These complimentary feedback signals are applied to a driver circuit 26 that generates a single-ended feedback signal, which is applied to a feedback input of the phase-lock loop 20.

The remaining driver circuits 24b–k output complimentary clock signals CLK-OUT and CLK-OUT* to respective clocked circuits 28b–k through respective pairs of conductors 30b–k. In the event the clock generator circuit 10 is used, for example, in a memory device, the circuits 28b–k may be memory arrays, although the circuits 28b–k may instead be any type of circuit found in memory devices. Also, of course, the clock generator circuit 10 may be used in devices other than memory devices.

The clock generator circuit 10, the clocked circuits 28 and the conductors 30 are preferably fabricated on a common substrate 34. In the case of an integrated circuit, the substrate 34 will normally be a semiconductor substrate, such as a silicon die. However, the components shown in FIG. 10 may instead be discrete circuits, in which case the substrate 34 may instead be a printed circuit board, for example.

As mentioned earlier, one of the problems that can develop if the processed clock signals are applied to a large number of circuits is the pairs of clock signals CLK-OUT and CLK-OUT* may arrive at respective circuits 28b–k at different times. To solve this problem, the conductors 30b–k coupling the clock signals CLK-OUT to the circuits 28b–k, respectively, are routed as shown in FIG. 2.

As shown in FIG. 2, all of the conductors 30b–k coupling the drivers 24b–k (FIG. 1) to the circuits 28b–k all have the same length. Using this approach, the conductor 30b coupling the clock signals CLK-OUT and CLK-OUT* to the circuit 28b farthest from the clock generator circuit 10 is relatively direct, while the conductors 30k coupling the clock signals CLK-OUT and CLK-OUT* to the circuit 28k closest to the clock generator circuit 10 are very serpentine. Although this approach is effective to equalize the times the clock signals CLK-OUT and CLK-OUT* are applied to the respective circuits 28, the amount of area consumed by the serpentine conductors 30 can be very problematic in some applications. For example, if the clock generator circuit 10, conductors 30 and clocked circuits 28 are fabricated on a semiconductor die, the serpentine conductors 30 can substantially increase the required size of the semiconductor die and hence the cost of an integrated circuit using the clock generator circuit 10.

The second problem that can develop if the processed clock signal is applied to a large number of clocked circuits 28 is the creation of phase jitter, which is the very problem the use of the phase-lock loop 20 was intended to avoid. With reference to FIG. 1, on each transition of the processed clock signal CLK-P, all of the driver circuits 24a–k switch at the same time, thereby drawing current at the same time. The result is a transient increase in current on each transition of the processed clock signal CLK-P, which generally produces a transient decrease in voltage of the power supplied to the phase-lock loop 20. For most phase-lock loop designs, the voltage transient causes a transient increase or decrease in the phase of the processed clock signal CLK-P produced by the locked-loop 20. As mentioned above, this transient increase or decrease in the phase of the processed clock signal CLK-P constitutes phase jitter. As mentioned previously, this phase jitter defeats the major reason for using the phase-lock loop 20, i.e., to reduce phase jitter.

There is therefore a need for a clock generator circuit that can provide a clock signal having reduced phase jitter to several circuits without consuming significant substrate area by routing the clock signals to the circuits through serpentine conductor paths.

SUMMARY OF THE INVENTION

A clock generator circuit and method is used to apply respective clock signals to a plurality of clocked circuits. A processed clock signal is generated by applying an input clock signal to a locked-loop, such as a phase-lock loop. The processed clock signal is delayed a plurality of respective delay times by a suitable delay circuit, such as a plurality of serially coupled delay elements, to generate a plurality of delayed clock signals. Each of the delayed clock signal is coupled through a respective signal path to a respective clocked circuit. The length of the signal paths through which each of the delayed clock signals is coupled is inversely proportional to the delay of the delayed clock signal that is coupled through the signal path. As a result, the delayed clock signals are applied to respective clocked circuits at substantially the same time.

DETAILED DESCRIPTION OF THE INVENTION

Figure 1:
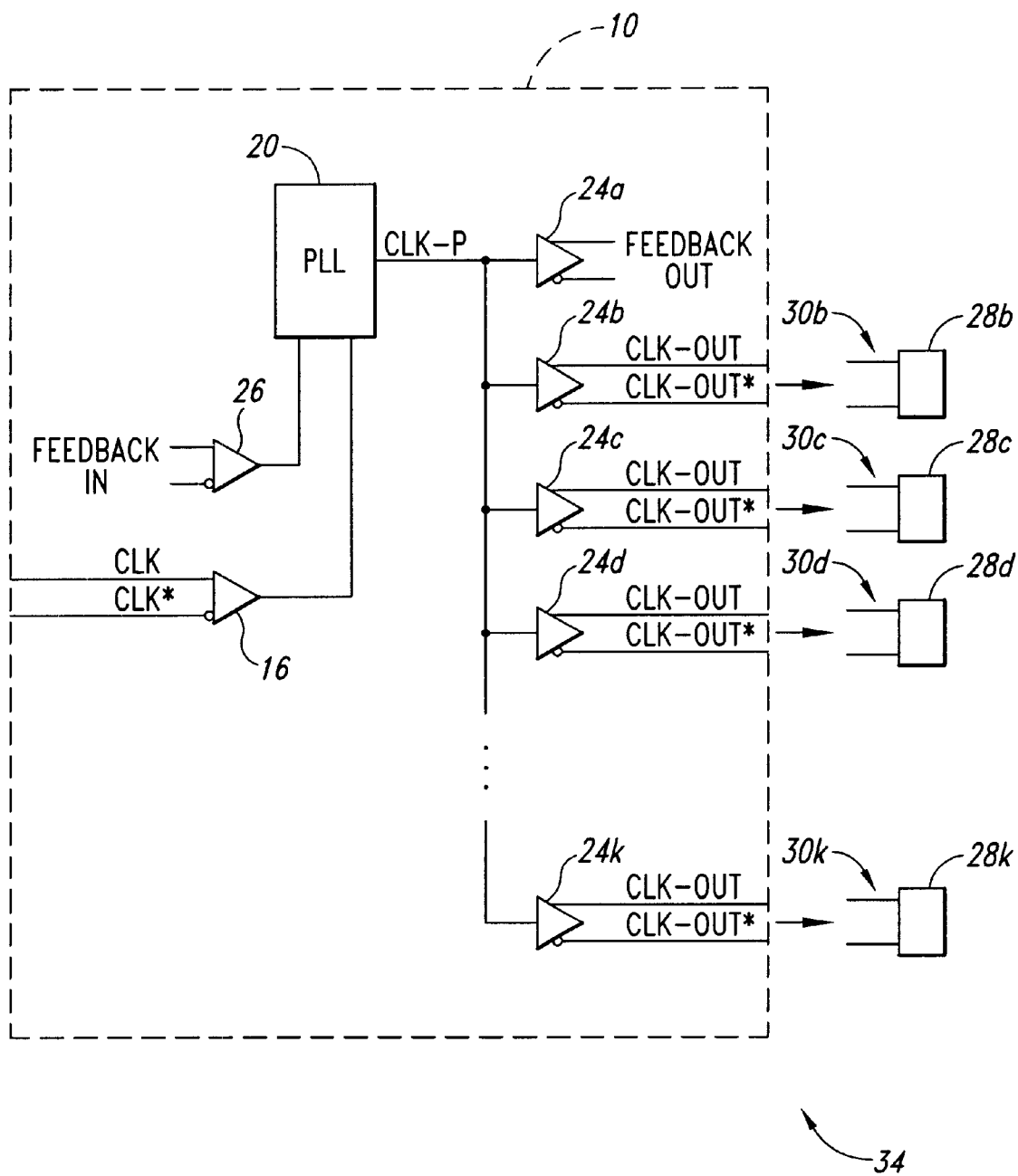
FIG. 1 is a logic diagram of a prior art clock generator circuit in which complimentary clock signals are processed by phase-lock loop and applied to a plurality of circuits.
Figure 3:
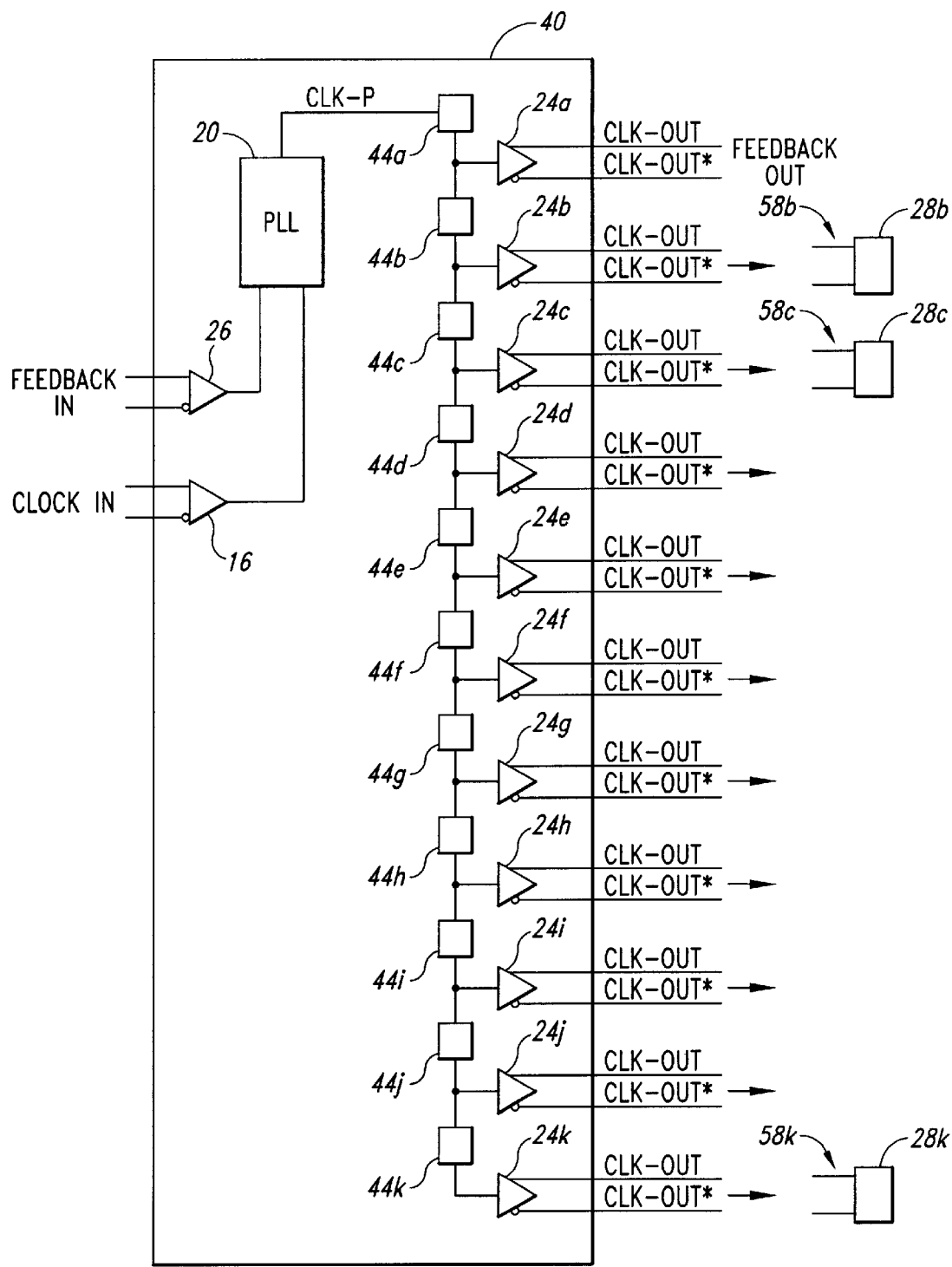
FIG. 3 is a logic diagram of a clock generator circuit in accordance with one embodiment of the invention in which complimentary clock signals are processed by phase-lock loop and applied to a plurality of circuits.

One embodiment of a clock generator circuit 40 in accordance with the invention is illustrated in FIG. 3, in which components that are common to the prior art clock generator circuit 10 of FIG. 1 have been provided with the same reference numeral. Like the clock generator circuit 10 of FIG. 1, the clock generator circuit 40 receives complimentary clock signals CLK and CLK* that are applied to the phase-lock loop 20 through a driver circuit 16. The phase-lock loop 20 generates a processed clock signal CLK-P that is applied to a plurality of series connected delay elements 44a–k of conventional design. An output from each of the delay elements 44a–k is applied to a respective one of the driver circuits 24a–k, and the driver circuits 24a–k generate respective pairs of complimentary clock signals CLK-OUT and CLK-OUT*.

As shown in FIG. 3, the complimentary clock signals CLK-OUT and CLK-OUT* from the first driver circuit 24a are used as complimentary feedback signals. These complimentary feedback signals are applied to the driver circuit 26 that applies a single-ended feedback signal to the phase-lock loop 20. The outputs of the remaining driver circuits 24b–k are coupled to respective circuits 28b–k through respective conductors 58b–k. Although the driver circuits 24a–k are shown in FIG. 3 as generating complimentary clock signals CLK-OUT and CLK-OUT*, it will be understood the driver circuits 24a–k may instead generate single-ended output signals. As with the clock generator circuit 10 of FIG. 1, the clock generator circuit 40, the clocked circuits 28 and the conductors 58 may be fabricated on a common substrate 60, such as a silicon die.

Figure 2:
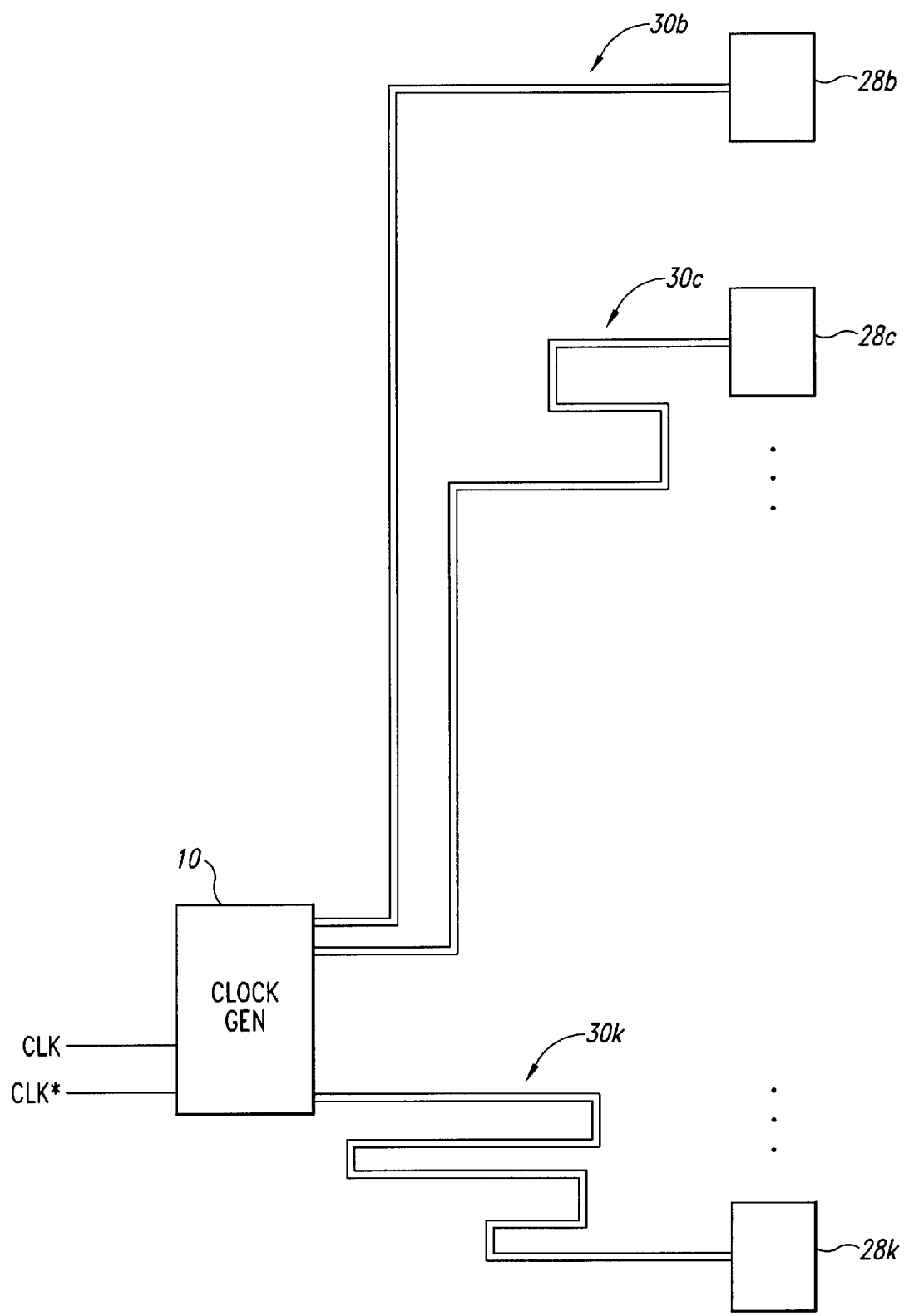
FIG. 2 is a block diagram showing the routing of clock signals from the clock generator circuit of FIG. 1 to respective clocked circuits.
Figure 4:
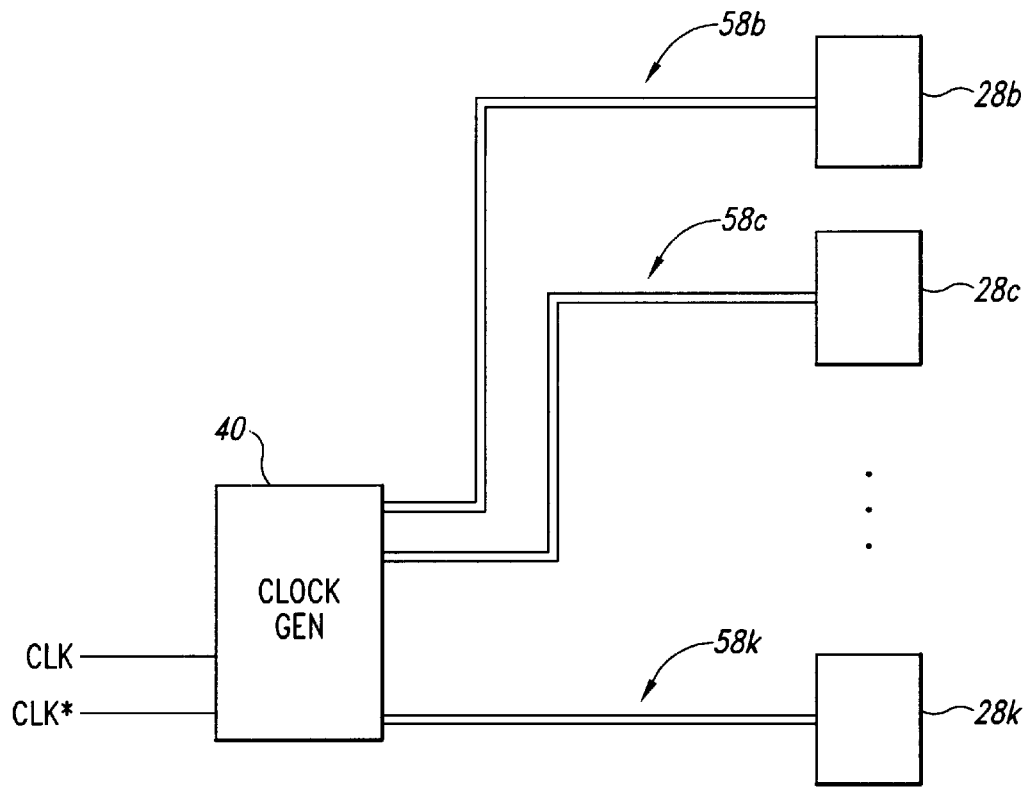
FIG. 4 is a block diagram showing the routing of clock signals from the clock generator circuit of FIG. 3 to respective clocked circuits.

Unlike the conductors 30 routing clock signals from the clock generator circuit 10 as shown in FIG. 2, the conductors 58b–k coupled to the circuits 28b–k in the clock generator circuit 40 may be of different lengths, as shown in FIG. 4. As a result, the propagation times of the clock signals CLK-OUT and CLK-OUT* though the conductors 58b–k vary from a relatively short propagation time through the conductors 58k coupled to the clocked circuit 28k closest to the clock generator circuit 40 to a relatively long propagation time through the conductors 58b coupled to the clocked circuit 28b farthest from the clock generator circuit 40. However, the delays of the delay elements 44c–k (FIG. 3) compensate for the differences in the propagation delays thought the conductors 58b–k. Thus, the conductors 58b coupled to the driver circuit 24b are connected to the circuit 28b farthest from the clock generator circuit 40, and the conductors 58k coupled to the driver circuit 24k are connected to the circuit 28k closest to the clock generator circuit 40. The delay of the delay element 44c to which the driver circuit 24c is connected is preferably equal to the difference between the propagation delay in the conductors 58b and the propagation delay in the conductors 58c. The delays of the remaining delay elements 44d–k are set in the same manner. The delays of the delay elements 44b–k may be equal to each other if the differences between the lengths of each pair of conductors 58b–k and the length of the adjacent pair of conductors 58 are equal to each other. Otherwise, the delays of the delay elements 44c–k can be adjusted accordingly.

The clock generator circuit 40 of FIG. 3 has at least two significant advantages over the clock generator circuit 10 of FIG. 1. First, the driver circuits 24a–k do not transition at the same time responsive to transitions of the CLK-P signal so that the current drawn by the driver circuits 24a–k as they each transition is spread out over a considerable period. As a result, the peak current drawn by the driver circuits 24a–k is only one-eleventh of the peak current drawn by the driver circuits 24a–k used in the clock generator circuit 10 of FIG. 1. The reduced peak current reduces the voltage transients applied to the phase-lock loop 20, thereby reducing the phase jitter of the phase-lock loop 20.

The second significant advantage of the clock generator circuit 40 over the clock generator circuit 10 of FIG. 1 is the ability to route the conductors 58b–k over the shortest signal path rather than routing the conductors over a serpentine path. Consequently, the area of the substrate 60 occupied by the conductors 58b–k is substantially less than would be required if the conductors 58b–k traveled serpentine paths. For a clock generator circuit 40 in which the substrate 60 is a semiconductor such as silicon, the reduced area occupied by the conductors 58b–k can make an integrated circuit using the clock generator circuit 40 considerably less expensive than an integrated circuit using the clock generator circuit 10 of FIG. 1.

Figure 5:
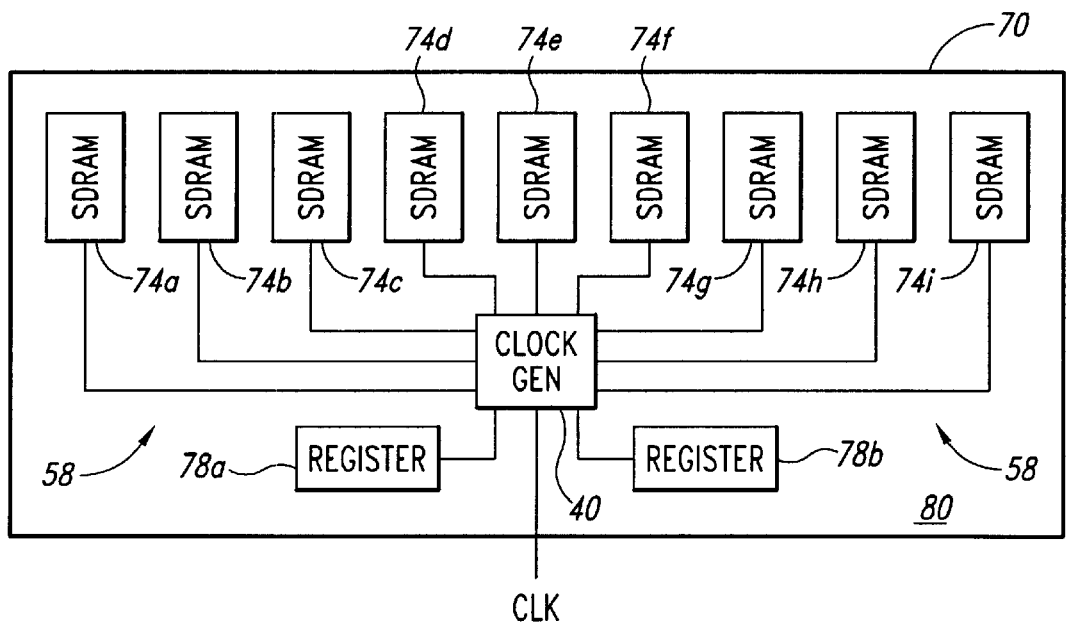
FIG. 5 is a block diagram of a memory module using the clock generator circuit of FIG. 3.

As mentioned above, the substrate 60 need not be a semiconductor die but instead may be, for example, a printed circuit board. As an example, a memory module 70 according to one embodiment of the invention is shown in FIG. 5. The memory module 70 of FIG. 5 includes the clock generator circuit 40 shown in FIG. 3, as well as a plurality of synchronous random access memories ("SDRAMs") 74a–i, each of which receives a respective pair of complimentary clock signals from the clock generator circuit 40 for synchronizing the operation of the SDRAM 74. The SDRAMs 74 also receive control signals, and they receive and output data signals, although these are not shown in FIG. 5 in the interest of clarity and brevity. The memory module 70 also includes a pair of clocked registers 78a,b that also receive a respective pair of complimentary clock signals from the clock generator circuit 40. As shown in FIG. 5, the topography of the SDRAMs 74 and the registers 78 are bilaterally symmetrical so that symmetrically positioned pairs of conductors 58 have the same length. As a result, each pair of conductors 58 having the same length are coupled to the same driver circuit 24 (FIG. 3). As is typically of conventional memory modules, the memory module 70 has a substrate 80 in the form of a printed circuit board that typically plugs into a motherboard (not shown) and includes a card-edge connector (not shown) for coupling signals to and from the memory module 70. One of these signals is a CLK signal as shown in FIG. 5, although the remaining signals have been omitted for purposes of clarity and brevity.

In operation, the clock generator circuit 40 receives the CLK signal and applies properly timed CLK-OUT and CLK-OUT* signals to each of the SDRAMs 74 and the registers 78. The CLK-OUT and CLK-OUT* signals applied to the SDRAMs 74$a,i$ are first generated by the clock generator circuit 40 at the same time and preferably by the same driver circuit 24 (FIG. 3). The CLK-OUT and CLK-OUT* signals are generated last and are coupled to only the center SDRAM 74$e$. Similarly, the CLK-OUT and CLK-OUT* signals applied to the registers 78 are generated at the same time and preferably by the same driver circuit 24. By providing a properly timed sequence of CLK-OUT and CLK-OUT* signals, the clock generator circuit 40 allows for relatively direct routing of the conductors 58, thereby avoiding the excessive use of the area of the substrate 80.

Figure 6:
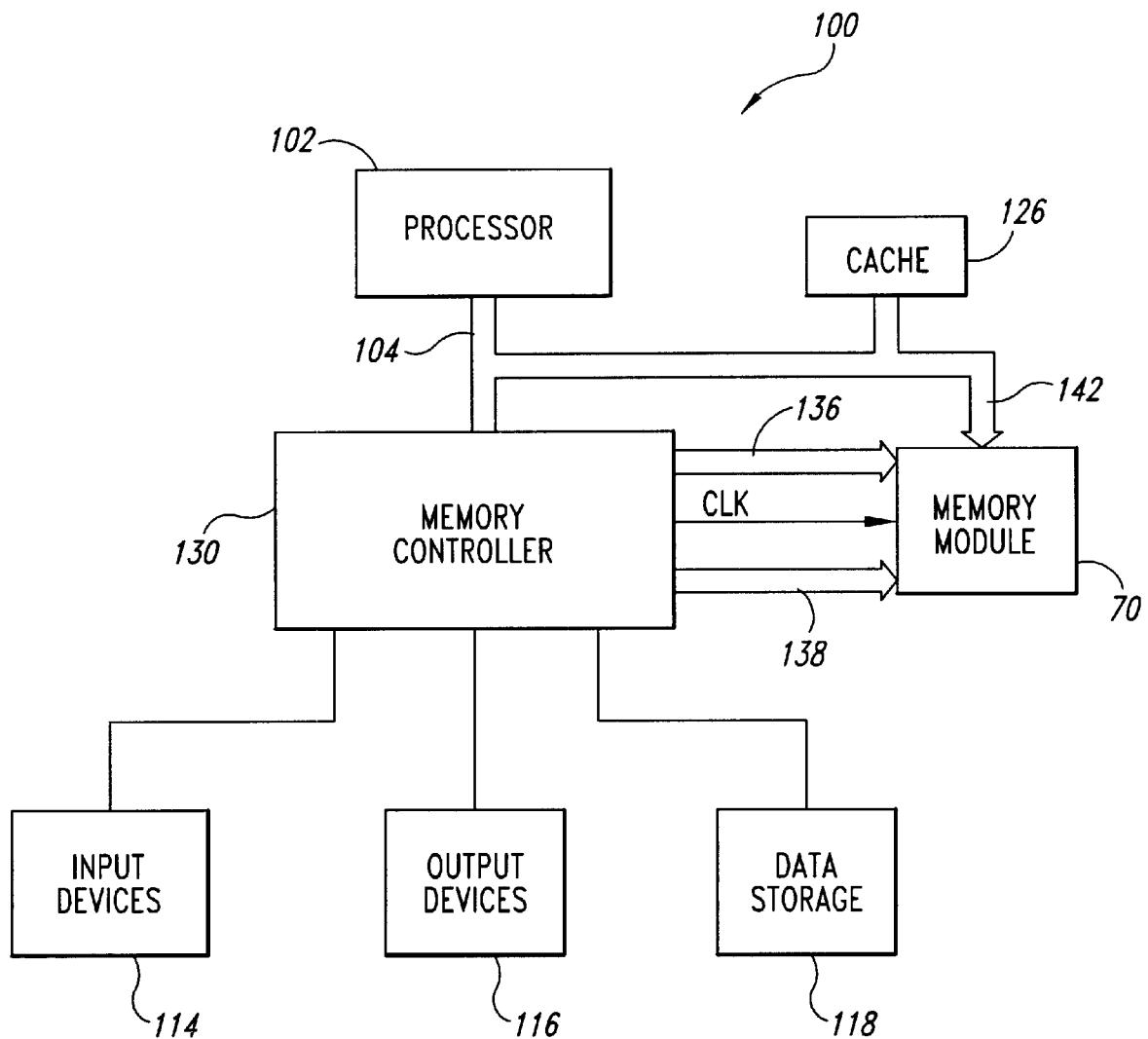
FIG. 6 is a block diagram of a computer system using the memory module of FIG. 5.

A computer system using the memory module 70 of FIG. 3 is shown in FIG. 6. The computer system 100 includes a processor 102 for performing various computing functions, such as executing specific software to perform specific calculations or tasks. The processor 102 includes a processor bus 104 that normally includes an address bus, a control bus, and a data bus. In addition, the computer system 100 includes one or more input devices 114, such as a keyboard or a mouse, coupled to the processor 102 to allow an operator to interface with the computer system 100. Typically, the computer system 100 also includes one or more output devices 116 coupled to the processor 102, such output devices typically being a printer or a video terminal. One or more data storage devices 118 are also typically coupled to the processor 102 to allow the processor 102 to store data in or retrieve data from internal or external storage media (not shown). Examples of typical storage devices 118 include hard and floppy disks, tape cassettes, and compact disk read-only memories (CD-ROMs). The processor 102 is also typically coupled to cache memory 126, which is usually static random access memory ("SRAM"), and to the memory module 70 through a memory controller 130. The memory controller 130 normally includes a control bus 136, an address bus 138, and a clock output 140 applying the CLK signal to the memory module 70. A data bus 142 is coupled from the memory module 70 to the processor bus 104 either directly (as shown), through the memory controller 130, or by some other means.

From the foregoing it will be appreciated that, although specific embodiments of the invention have been described herein for purposes of illustration, various modifications may be made without deviating from the spirit and scope of the invention. For example, although a delay circuit implemented with a plurality of series coupled delay elements 44 is shown in FIG. 3, it will be understood that other delay circuits, such as a plurality of parallel-coupled delay elements, may instead be used. Similarly, although the clock generator circuit 40 is shown as applying complimentary clock signals to the clocked circuits 28, it will be understood that single-ended clock signals may instead be used. Also, the discrete drivers 24 shown in FIG. 3 may instead be incorporated into the delay elements 44, and the clock signal applied to the delay elements 44 may, instead of being generated by the phase-lock loop 20, be generated by other locked-loops, such as a delay-lock loop (not shown), or by means other than a locked-loop. Other modifications to the clock generator circuit 40 shown in FIG. 4 will be apparent to one skilled in the art. Accordingly, the invention is not limited except as by the appended claims.

What is claimed is:

1. A clock generator circuit, comprising:
    a locked-loop receiving a clock signal and generating a processed clock signal responsive thereto;
    a delay circuit receiving the processed clock signal from the locked-loop, the delay circuit having a plurality of output terminals generating respective delayed clock signals that have respective phases with respect to the processed clock signal that differ from each other;
    a plurality of driver circuits each having an input terminal coupled to an output terminal of the delay circuit, the driver circuits outputting at respective output terminals respective clock signals having phases relative to the processed clock signal that are different from each other; and
    a plurality of conductors coupled to the output terminals of respective driver circuits, the lengths of at least some of the conductors being different from the lengths of others of the conductors.

2. The clock generator circuit of claim 1 wherein the locked-loop comprises a phase-lock loop.

3. The clock generator circuit of claim 1 wherein the delay circuit comprises a plurality of series-connected delay elements each having an input terminal and an output terminal, the input terminal of a first of the delay elements in the series being coupled to receive the processed clock signal from the locked-loop.

4. The clock generator circuit of claim 1 wherein the locked-loop, delay circuit, and driver circuits are fabricated as an integrated circuit on a common substrate.

5. The clock generator circuit of claim 1 wherein the locked-loop, delay circuit, and driver circuits are fabricated as discrete circuits mounted on a common substrate.

6. The clock generator circuit of claim 5 wherein the common substrate comprises a printed circuit board.

7. The clock generator circuit of claim 1 wherein each of the driver circuits receive a single clock signal from a output terminal of the delay circuit, each of the driver circuits being structured to generate complimentary clock signals responsive thereto.

8. A clock generator circuit, comprising:
    a plurality of series-connected delay elements each having an input terminal and an output terminal, the input terminal of the first of the delay elements being coupled to receive an input clock signal;
    a plurality of driver circuits each having an input terminal coupled to an output terminal of a respective delay element, the driver circuits outputting at respective output terminals respective clock signals having phases relative to the input clock signal that are different from each other; and
    a plurality of conductors coupled to the output terminals of respective driver circuits, the lengths of at least some of the conductors being different from the lengths of others of the conductors.

9. The clock generator circuit of claim 8, further comprising a locked-loop receiving a clock signal and generating the input clock signal responsive thereto.

10. The clock generator circuit of claim 9 wherein the locked-loop comprises a phase-lock loop.

11. The clock generator circuit of claim 8 wherein the delay elements and driver circuits are fabricated as an integrated circuit on a common substrate.

12. The clock generator circuit of claim 8 wherein the delay elements and driver circuits are fabricated as discrete circuits mounted on a common substrate.

13. The clock generator circuit of claim 12 wherein the common substrate comprises a printed circuit board.

14. The clock generator circuit of claim 8 wherein each of the driver circuits receive a single clock signal from a respective delay element, each of the driver circuits being structured to generate complimentary clock signals responsive thereto.

15. An electronic assembly comprising:
a locked-loop receiving a clock signal and generating a processed clock signal responsive thereto;
a plurality of series-connected delay elements coupled to receive the processed clock signal from the locked-loop, each of the delay elements having an input terminal and an output terminal;
a plurality of driver circuits each having an input terminal coupled to an output terminal of a respective delay element, the driver circuits outputting at respective output terminals respective clock signals having phases relative to the processed clock signal that are different from each other;
a plurality of clocked circuits structured to operate responsive to a received clock signal; and
a respective conductor coupled between an output terminal of each driver circuit and a respective one of the clocked circuits, the conductors coupled to at least some of the clocked circuits having a length different from the lengths of others of the conductors coupled to others of the clocked circuits.

16. The electronic assembly of claim 15 wherein the locked-loop, delay elements, driver circuits, conductors and clocked circuits are fabricated as an integrated circuit on a common substrate.

17. The electronic assembly of claim 15 wherein each of the driver circuits receives a single clock signal from a respective delay element, each of the driver circuits being structured to generate complimentary clock signals responsive thereto.

18. The electronic assembly of claim 15 wherein the lengths of the conductors are inversely proportional to the phases of respective clock signals coupled through the conductors.

19. The electronic assembly of claim 15 wherein the electronic assembly comprises a memory device.

20. The electronic assembly of claim 15 wherein the locked-loop, the delay elements, the driver circuits, the conductors, and the memory device are fabricated as an integrated circuit on a common substrate.

21. The electronic assembly of claim 15 wherein the electronic assembly comprises a memory module containing a plurality of memory devices.

22. The electronic assembly of claim 15 wherein the electronic assembly comprises a memory module containing a plurality of memory devices mounted on a common substrate.

23. The electronic assembly of claim 22 wherein the common substrate comprises a printed circuit board.

24. The electronic assembly of claim 15 wherein the locked-loop comprises a phase-lock loop.

25. The electronic assembly of claim 15 wherein the locked-loop, delay elements, and driver circuits are fabricated as discrete circuits mounted on a common substrate.

26. The electronic assembly of claim 25 wherein the common substrate comprises a printed circuit board.

27. An electronic assembly comprising:
a plurality of series-connected delay elements each having an input terminal and an output terminal, the input terminal of the first of the delay elements being coupled to receive an input clock signal;
a plurality of driver circuits each having an input terminal coupled to an output terminal of a respective delay element, the driver circuits outputting at respective output terminals respective clock signals having phases relative to the processed clock signal that are different from each other;
a plurality of clocked circuits structured to operate responsive to a received clock signal; and
a respective conductor coupled between the output terminal of each of the driver circuits and a respective one of the clocked circuits, the conductors coupled to at least some of the clocked circuits having a length different from the lengths of others of the conductors coupled to others of the clocked circuits.

28. The electronic assembly of claim 27, further comprising a locked-loop receiving a clock signal and generating the input clock signal responsive thereto.

29. The electronic assembly of claim 28 wherein the locked-loop comprises a phase-lock loop.

30. The electronic assembly of claim 27 wherein the lengths of the conductors are inversely proportional to the phases of respective clock signals coupled through the conductors.

31. The electronic assembly of claim 27 wherein the electronic assembly comprises a memory device.

32. The electronic assembly of claim 27 wherein the delay elements, the driver circuits, the conductors, and the memory device are fabricated as an integrated circuit on a common substrate.

33. The electronic assembly of claim 27 wherein the electronic assembly comprises a memory module containing a plurality of memory devices.

34. The electronic assembly of claim 27 wherein the electronic assembly comprises a memory module containing a plurality of memory devices mounted on a common substrate.

35. The electronic assembly of claim 34 wherein the common substrate comprises a printed circuit board.

36. The electronic assembly of claim 27 wherein the delay elements, driver circuits, conductors and clocked circuits are fabricated as an integrated circuit on a common substrate.

37. The electronic assembly of claim 27 wherein the delay elements, and driver circuits are fabricated as discrete circuits mounted on a common substrate.

38. The electronic assembly of claim 37 wherein the common substrate comprises a printed circuit board.

39. The electronic assembly of claim 27 wherein each of the driver circuits receives a single clock signal from a respective delay element, each of the driver circuits being structured to generate complimentary clock signals responsive thereto.

40. A memory module, comprising:
a substrate;
a locked-loop mounted on the substrate, the locked-loop receiving a clock signal and generating a processed clock signal responsive thereto;
a plurality of series-connected delay elements mounted on the substrate each having an input terminal and an output terminal, the first of the series-connected delay elements coupled to receive the processed clock signal from the locked-loop, each of the delay elements structured to generate at its output terminal a respective delayed clock signal having a phase that is different from the delayed clock signals generated at the output terminals of other of the delay elements;

a plurality of driver circuits mounted on the substrate, each driver circuit having an input terminal coupled to an output terminal of a respective delay element, the driver circuits outputting at respective output terminals respective clock signals having phases relative to the processed clock signal that are different from each other;

a plurality of memory devices mounted on the substrate, each of the memory devices structured to operate responsive to a received clock signal; and a respective conductor structured to couple a delayed clock signal from the output terminal of a respective one of the driver circuits to a respective one of the memory devices, the conductors coupled to at least some of the memory devices having a length different from the lengths of others of the conductors coupled to others of the memory devices.

41. The memory module of claim 40 wherein the substrate comprises a printed circuit board.

42. The memory module of claim 40 wherein the locked-loop comprises a phase-lock loop.

43. The memory module of claim 40 wherein the lengths of the conductors are inversely proportional to the phases of respective delayed clock signal coupled through the conductors.

44. The memory module of claim 40 wherein each of the memory devices comprise a synchronous random access memory.

45. The memory module of claim 40 further comprising at least one clocked register circuit, the clocked register circuit receiving a clock signal from a respective delay element.

46. The memory module of claim 40 wherein each of the driver circuits receive a single clock signal from a respective delay element, each of the driver circuits being structured to generate complimentary clock signals responsive thereto.

47. A computer system, comprising:

computer circuitry operable to perform computing functions;

at least one input device coupled to the computer circuitry;

at least one output device coupled to the computer circuitry;

at least one data storage devices coupled to the computer circuitry; and a memory module, comprising:
  a substrate;
  a locked-loop mounted on the substrate, the locked-loop receiving a clock signal and generating a processed clock signal responsive thereto;
  a plurality of series-connected delay elements mounted on the substrate each having an input terminal and an output terminal, the first of the series-connected delay elements coupled to receive the processed clock signal from the locked-loop, each of the delay elements structured to generate at its output terminal a respective delayed clock signal having a phase that is different from the delayed clock signals generated at the output terminals of other of the delay elements;
  a plurality of driver circuits mounted on the substrate, each of the driver circuits having an input terminal coupled to an output terminal of a respective delay element, the driver circuits outputting at respective output terminals respective clock signals having phases relative to the processed clock signal that are different from each other;
  a plurality of memory devices mounted on the substrate, each of the memory devices structured to operate responsive to a received clock signal; and
  a respective conductor structured to couple a delayed clock signal from a respective one of the driver circuits to a respective one of the memory devices, the conductors coupled to at least some of the memory devices having a length different from the lengths of others of the conductors coupled to others of the memory devices.

48. The computer system of claim 47 wherein each of the driver circuits receive a single clock signal from a respective delay element, each of the driver circuits being structured to generate complimentary clock signals responsive thereto.

49. The computer system of claim 47 wherein the substrate comprises a printed circuit board.

50. The computer system of claim 47 wherein the locked-loop comprises a phase-lock loop.

51. The computer system of claim 47 wherein the lengths of the conductors are inversely proportional to the phases of respective delayed clock signal coupled through the conductors.

52. The computer system of claim 47 wherein each of the memory devices comprises a synchronous random access memory.

53. The computer system of claim 47 further comprising at least one clocked register circuit, the clocked register circuit receiving a clock signal from a respective delay element.

54. A method of applying a clock signal to a plurality of clocked circuits, comprising:

delaying an input clock signal a plurality of respective delay times to generate a plurality of delayed clock signals having phases relative to the phase of the input clock signal that are different from each other; and coupling each of the delayed clock signals through a clock signal driver to a respective signal path to a respective clocked circuit, the length of each of the signal paths being inversely proportional to the delay of the delayed clock signal that is coupled through the signal path so that each of the delayed clock signals reach a respective one of the clocked circuits at substantially the same time.

55. The method of claim 54 wherein the act of delaying the input clock signal a plurality of respective delay times comprises sequentially delaying the input clock signal.

56. The method of claim 54 wherein the act of coupling each of the delayed clock signals through a respective signal path comprises coupling the delayed clock signals through respective driver circuits.

57. A method of applying a clock signal to a plurality of clocked circuits, comprising:

generating a plurality of clock signals having phases that are different from each other;

switching a plurality of driver circuits responsive to each transition of a respective one of the clock signals; and coupling each of the driver circuits through a respective signal path to a respective clocked circuit, the length of each of the signal paths being inversely proportional to the phase of the clock signal coupled through the signal path.

58. The method of claim 57 wherein the act of generating a plurality of clock signals having phases that are different from each other comprises:

providing an input clock signal; and sequentially delaying the input clock signal.

59. The method of claim 58 wherein the act of providing an input clock signal comprises applying a clock signal to a locked-loop, and generating the input clock signal from the locked-loop.

60. A method of clocking a plurality of circuits receiving respective clock signals through signal paths of varying lengths, the method comprising:

generating a plurality of clock signals having phases that are different from each other by virtue of an added delay, the added delay being inversely proportional to the varying lengths of the respective signal paths through which each of the circuits receives its clock signal; and receiving the plurality of clock signals having phases different from each other and driving these signals through the respective signal paths to the clocked circuits.

61. The method of claim 60 in which an initial clock signal from which the plurality of clock signals are generated is derived from a locked-loop.

* * * * *